United States Patent
Simkin

(10) Patent No.: US 11,302,030 B2
(45) Date of Patent: Apr. 12, 2022

(54) SYSTEM, METHOD, AND TARGET FOR WAFER ALIGNMENT

(71) Applicant: KLA Corporation, Milpitas, CA (US)

(72) Inventor: Arkady Simkin, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/141,984

(22) Filed: Jan. 5, 2021

(65) Prior Publication Data

US 2021/0358165 A1 Nov. 18, 2021

Related U.S. Application Data

(60) Provisional application No. 63/024,616, filed on May 14, 2020.

(51) Int. Cl.
| | | |
|---|---|---|
| *G06K 9/00* | (2006.01) | |
| *G06T 7/73* | (2017.01) | |
| *G06K 9/78* | (2006.01) | |
| *G06T 7/00* | (2017.01) | |
| *H01L 21/68* | (2006.01) | |

(Continued)

(52) U.S. Cl.
CPC .................. *G06T 7/73* (2017.01); *G06K 9/78* (2013.01); *G06T 7/0004* (2013.01); *H01L 21/681* (2013.01); *H01L 23/544* (2013.01); *G06T 2207/30148* (2013.01);
(Continued)

(58) Field of Classification Search
CPC ........................................... G06T 2207/30148
See application file for complete search history.

(56) References Cited

U.S. PATENT DOCUMENTS

| | | |
|---|---|---|
| 6,544,805 B2 | 4/2003 | Holcman et al. |
| 8,198,906 B2 | 6/2012 | Strom |

(Continued)

FOREIGN PATENT DOCUMENTS

| | | |
|---|---|---|
| KR | 1020060118428 A | 11/2006 |
| KR | 1020170070632 A | 6/2017 |

OTHER PUBLICATIONS

PCT International Search Report and Written Opinion for International Application No. PCT/US2021/030985 dated Sep. 2, 2021, 6 pages.

*Primary Examiner* — Hadi Akhavannik
(74) *Attorney, Agent, or Firm* — Suiter Swantz pc llo

(57) ABSTRACT

A wafer alignment system includes an imaging sub-system, a controller, and a stage. The controller receives image data for reference point targets and determines a center location for each of the reference point targets. The center location determination includes identifying sub-patterns within a respective reference point target and identifying multiple center location candidates for the respective reference point target. The step of identifying the multiple center location candidates for the respective reference point target includes: applying a model to each identified sub-pattern of the respective reference point target, wherein the model generates a hotspot for each sub-pattern that identifies a center location candidate for the respective reference point target. The controller is further configured to determine a center location for the respective reference point target based on the multiple center location candidates and determine an orientation of the wafer based on the center location determination for the reference point targets.

29 Claims, 10 Drawing Sheets

(51) Int. Cl.
*H01L 23/544* (2006.01)
*H04N 5/225* (2006.01)

(52) U.S. Cl.
CPC ............... *H01L 2223/5442* (2013.01); *H01L 2223/54426* (2013.01); *H04N 5/2256* (2013.01)

(56) References Cited

U.S. PATENT DOCUMENTS

| | | |
|---|---|---|
| 8,339,605 B2 | 12/2012 | Ausschnitt et al. |
| 2002/0025479 A1* | 2/2002 | Okamoto ................. G03F 1/36 430/5 |
| 2002/0105649 A1* | 8/2002 | Smith ................. G03F 7/70591 356/401 |
| 2008/0259334 A1* | 10/2008 | Ausschnitt .......... G03F 7/70633 356/401 |
| 2010/0139836 A1* | 6/2010 | Horikoshi ............... H01L 21/68 156/64 |
| 2013/0244350 A1* | 9/2013 | Horikoshi ............... H01L 21/68 438/16 |
| 2019/0148202 A1* | 5/2019 | Chao .................... G03F 9/7003 414/784 |
| 2019/0242782 A1* | 8/2019 | Medvedyeva ...... G03F 7/70641 |
| 2020/0075432 A1* | 3/2020 | Mirin ..................... H01L 22/12 |
| 2020/0335473 A1* | 10/2020 | Zhou ..................... H01L 23/544 |

\* cited by examiner

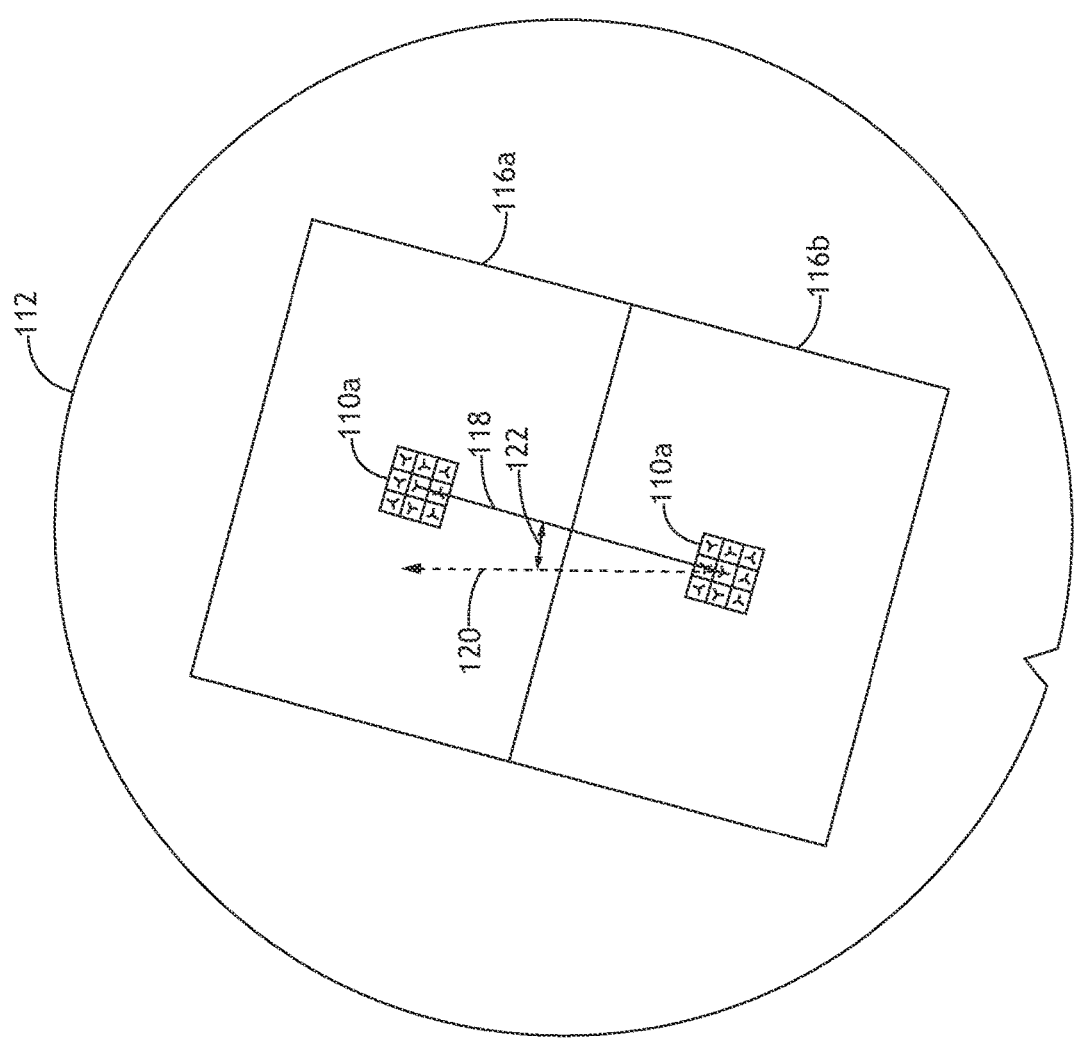

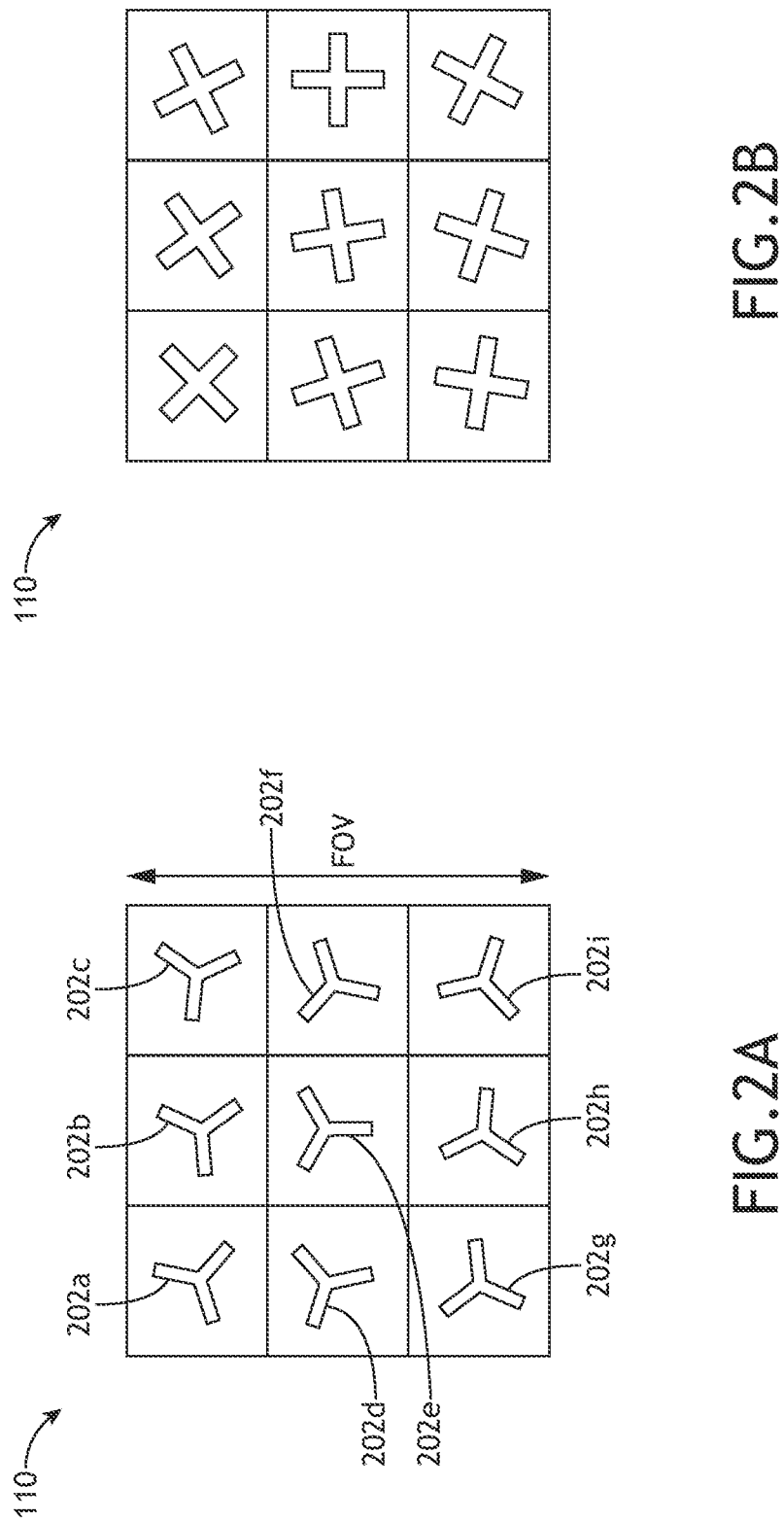

SYSTEM, METHOD, AND TARGET FOR WAFER ALIGNMENT

CROSS-REFERENCE TO RELATED APPLICATION

The present application claims the benefit under 35 U.S.C. § 119(e) of U.S. Provisional Application Ser. No. 63/024,616, filed May 14, 2020, naming Arkady Simkin as inventor, which is incorporated herein by reference in the entirety.

TECHNICAL FIELD

The present disclosure relates generally to wafer alignment and, more particularly, a target and process that improves wafer alignment and reduces the time needed to execute a wafer alignment process.

BACKGROUND

Wafer alignment using a high-resolution camera includes acquisition of reference points (i.e., patterns printed on a wafer with unique in field of view). Simple patterns like a 'cross in the square' are currently used for this purpose. In currently implemented approaches, the target acquisition process is highly sensitive to the accuracy of camera positioning over a reference point pattern (RPP). In cases where the pattern is seen partially in a field of view, acquisition score of the pattern might be low and lead to a failed acquisition of the pattern. In cases where a shift in the wafer position is large enough and the reference point pattern is not seen in field of view, an overlay tool may be used to scan around the expected location to find the reference point. The scan requires grabbing overlapped images to ensure that one of the images will fully contain the reference point. This process is time consuming and impacts throughput. To guarantee accurate positioning, current approaches include performing a preliminary alignment step prior to a high-resolution camera alignment step. This preliminary step is performed using a low-resolution camera with a field of view larger than the high-resolution camera. Such an approach requires additional optics and components on a given tool and impacts. Therefore, it would be desirable to provide a system and method that cures the shortcomings of the currently employed approaches described above.

SUMMARY

A wafer alignment system is disclosed, in accordance with one or more illustrative embodiments of the present disclosure. In one illustrative embodiment, the system includes an imaging sub-system. In another illustrative embodiment, the system includes a stage configured to secure and actuate a wafer, wherein two or more reference point targets are formed on the wafer, wherein each reference point target comprises a plurality of sub-patterns arranged in an array, wherein each sub-pattern is different from the other sub-patterns of the plurality of sub-patterns. In another illustrative embodiment, the system includes a controller coupled to the imaging sub-system and the stage, the controller including one or more processors configured to execute program instructions causing the one or more processors to: receive image data of the two or more reference point targets from the imaging sub-system; determine a center location for each of the two or more reference point targets, wherein determining the center location of each of the two or more reference point targets comprises: identify each sub-pattern within a respective reference point target via a pattern recognition process; identify a plurality of center location candidates for the respective reference point target, wherein identifying the plurality of center location candidates for the respective reference point target comprises: applying a model to each identified sub-pattern of the respective reference point target, wherein the model generates a hotspot for each sub-pattern that identifies a center location candidate for the respective reference point target; and determine a center location for the respective reference point target based on the plurality of center location candidates. The controller is further configured to: determine an orientation of the wafer relative to a coordinate system of the stage based on the center location determined for each of the two or more reference point targets; and direct the stage to adjust the position of the wafer to align the wafer with the stage coordinate system based on the determined orientation of the wafer.

A method of wafer alignment is disclosed, in accordance with one or more illustrative embodiments of the present disclosure. In one illustrative embodiment, the method includes acquiring image data of reference point targets including a set of sub-patterns. In another illustrative embodiment, the method includes determining a center location for each of the reference point targets, wherein determining the center location of each of the two or more reference point targets comprises: identifying each sub-pattern within a respective reference point target a via pattern recognition process; identifying a plurality of center candidates for the respective reference point target, wherein identifying the plurality of center point candidates for the respective reference point target comprises: applying a model to each identified sub-pattern of the respective reference point target to identify a center location candidate of the respective reference point target, wherein the model generates a hotspot for each sub-pattern that identifies a center location candidate associated with the respective reference point target; and determining a center location of the respective reference point target based on the plurality of center candidates. In another illustrative embodiment, the method includes determining an orientation of the wafer relative to a coordinate system of the stage based on the center location determined for each of the two or more reference point targets. In another illustrative embodiment, the method includes directing the stage to adjust the position of the wafer to align the wafer with the stage coordinate system based on the determined orientation of the wafer.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 1B is a conceptual view of a wafer orientation measurement process, in accordance with one or more embodiments of the present disclosure.

FIG. 2A illustrates a top plan view of a reference point target suitable for use with the wafer alignment system, in accordance with one or more embodiments of the present disclosure.

FIGS. 2B-2D illustrate top plan views of reference point targets suitable for use with the wafer alignment system, in accordance with one or more alternative embodiments of the present disclosure.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to a reference point target suitable for implementation within a wafer alignment system and process. The reference point target includes multiple unique sub-patterns (i.e., different orientation and/or shape). Embodiments of the present disclosure identify these sub-patterns and utilize a model that identifies a hotspot, which corresponds to a center location candidate, for each sub-pattern. The center location of the reference point target is then determined based on the multiple center location candidates associated with the sub-patterns. Embodiments of the present disclosure determine an orientation of a wafer by acquiring the center location for multiple reference point targets. Embodiments of the present disclosure may be implemented to provide for automatic wafer alignment and may increase robustness of the wafer alignment process for various overlay tools (e.g., the same design reference pattern target design may be used both with high-resolution measurement camera and with mid-resolution camera). Embodiments of the present disclosure may enable robust train-less wafer alignment. During recipe setup, a user may implement the wafer alignment system and process of the present disclosure by only specifying the type(s) and location(s) of the pattern(s).

Figure 1A:
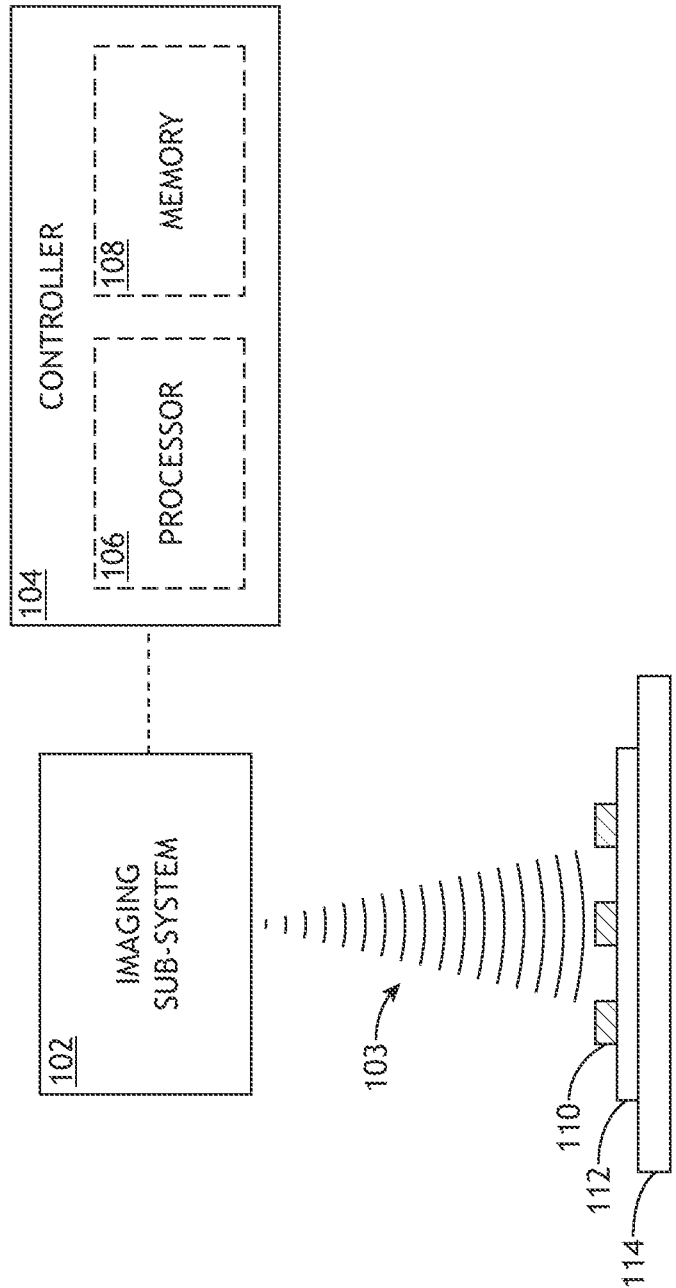
FIG. 1A is a conceptual view of a wafer alignment system, in accordance with one or more embodiments of the present disclosure.

FIG. 1A is a conceptual view of a wafer align system 100, in accordance with one or more embodiments of the present disclosure. The system 100 may include, but is not limited to, an imaging sub-system 102. The system 100 may additionally include, but is not limited to, a controller 104. The controller 104 may include one or more processors 106 and memory medium 108. In embodiments, the imaging sub-system 102 may be configured to acquire images of the reference point targets 110. For example, the imaging sub-system 102 may direct illumination 103 to a wafer 112 disposed on a stage 114. The imaging sub-system 102 may collect (e.g., via camera) radiation emanating (e.g., reflected, scattered, or diffracted) from the wafer 112 (e.g., semiconductor wafer) and the reference point targets 110 and generate images of the reference point targets 110. The reference point targets 110 disposed on the wafer 112 may be used to make rotational adjustments to the wafer 112 (via stage 114) to align the wafer 112 with the coordinate system of the stage 114. While the focus of the present disclosure is on wafer alignment, it is noted that the scope of the present disclosure is not limited to the alignment of only wafers. In this sense, the embodiments of the present disclosure may be extended to any sample known in the art such as, but not limited to, a reticle, photomask, or sensor array.

In embodiments, the controller 104 is communicatively coupled to the imaging sub-system 102. The one or more processors 106 of controller 104 may execute any of the various process steps described throughout the present disclosure. In embodiments, the controller 104 is configured to generate and provide one or more control signals configured to perform one or more adjustments of the stage 114 to adjust the position/orientation of the wafer 112.

The imaging sub-system 102 may include any optical sub-system 102 known in the art. For the purposes of the present disclosure, the term 'wafer alignment system' is interchangeable with the term 'wafer alignment tool.' In this sense, the imaging sub-system 102 and the controller 104 may form the wafer alignment system 100 (or wafer alignment tool). It is noted that the wafer alignment system 100 may be integrated with any characterization system/tool known in the art. For example, the functions of the wafer alignment system 100 may be integrated with an imaging overlay metrology system or an optical inspection system. In this sense, the controller 104 of the wafer alignment system 100 may be integrated with the camera and optics of such a characterization system/tool.

FIG. 1B illustrates a conceptual view of the use of the reference point targets 110 to align the wafer 112, in accordance with one or more embodiments of the present disclosure. In embodiments, the two or more reference point targets 110a, 110b are disposed on the wafer 112. As depicted in FIG. 1B, the reference point targets 110a, 110b may be disposed within different fields of the wafer along a straight line. The reference point targets 110a, 110b may be formed on the wafer 112 in any manner known in the art. For example, the reference point targets 110a, 110b may be formed via lithographic printing.

In embodiments, the wafer alignment system 100 measures the angular orientation (i.e., angle) of the wafer 112 relative to the coordinate system of the stage 114. In turn, the controller 104 of the wafer alignment system 100 may direct the stage 114 to rotate the wafer 112 by a selected angle to align the wafer 112 with the coordinate system of the stage 114.

In embodiments, the wafer alignment system 100 acquires a location of two or more reference point targets 110a, 110b located on the wafer 112. In embodiments, the controller 104 calculates a wafer angle 122, which may be defined by the vector 118 between the reference point targets 110a, 110b and the vector 120 associated with the direction of stage movement angle. In embodiments, the controller 104 of the wafer alignment system 100 directs the stage 114 to rotate the wafer 112 by the calculated angle. It is noted that when accuracy of the wafer rotation does not allow accurate alignment, the measured angle of the wafer 112 may be applied mathematically to further movements in order to compensate for the remaining wafer angle between the vector 120 and 122.

In embodiments, the controller 104 may execute process steps to determine a location of the reference point targets 110a, 110b. For the purposes of the present disclosure, the controller 104 determines the center location of the reference point targets and utilizes the center location as the location of the respective reference point target. In this sense, 'center location' and 'location' of a reference point target should be interpreted as interchangeable.

The controller 104 may determine the center locations of each of the reference point targets 110a, 110b using the target designs of the targets described in the present disclosure. Examples of reference point target designs are described throughout the present disclosure.

FIG. 2A illustrates a top plan view of a reference point target 110 suitable for use with the wafer alignment system 100, in accordance with one or more embodiments of the present disclosure. In embodiments, each reference point target 110 is formed of a set of sub-patterns. For example, as shown in FIG. 2A, the reference point target 110 may include, but is not limited to, sub-patterns 202a-202i. In embodiments, the sub-patterns 202a-202i may be arranged in an array (e.g., 3×3 array of cells). In embodiments, the size of the reference point target 110 may be selected to match the size of the field of view (FOV) of the camera system of the imaging sub-system 102. For example, the size and spacing of the sub-patterns 202a-202i may be selected to match the size of the FOV (e.g., 60 μm) of the camera system of the imaging sub-system 102. It is noted that while the examples of the present disclosure focus on the reference point targets including nine sub-patterns this should not be interpreted as a limitation on the scope of the present disclosure. Rather, it is noted that the reference point targets of the present disclosure may include any number of sub-patterns in any sized array (e.g., 2×2, 3×3, 4×4, etc.).

In embodiments, each sub-pattern is different from the other sub-patterns of the array of sub-patterns. For example, sub-pattern 202a is different from 202b-202i, sub-pattern 202b is different from 202a and 202c-202i, and so on. In this sense, in the case of a 3×3 array, a given reference point target 110 may include nine unique sub-patterns distributed evenly throughout the reference point target 110. It is noted that the difference between the sub-patterns helps reduce the likelihood of ambiguity in the sub-pattern acquisition/measurement process.

The difference between sub-patterns within a given reference point target 110 may be accomplished by varying the orientation and/or the shape of each sub-pattern.

Figure 2D:
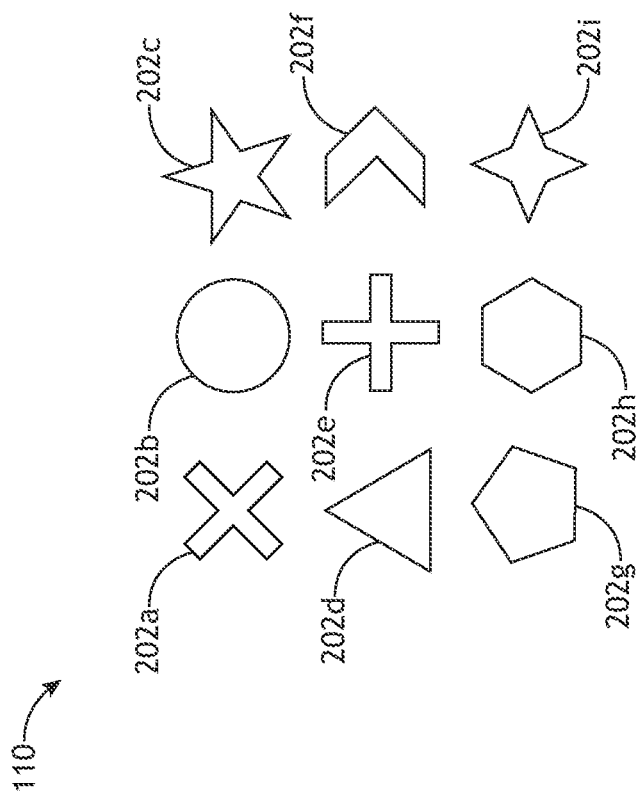
Figure 2C:
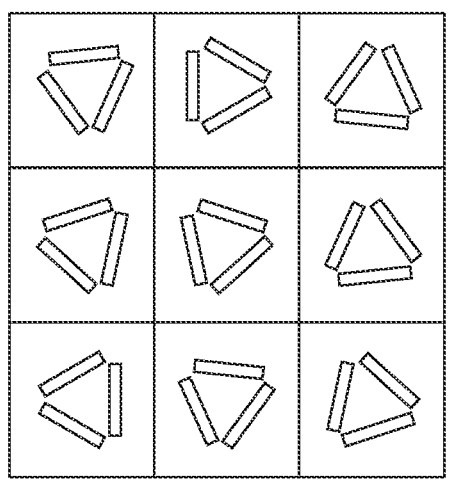

In embodiments, the sub-patterns 202a-202i of a given reference point pattern 110 have the same shape and different orientations. For example, as shown in FIG. 2A, each of the sub-patterns 202a-202i has a three-ray shape. In this example, each three-ray pattern is rotated by 12° relative to its nearest neighboring sub-pattern. For instance, sub-pattern 202b is rotated by +12° (clockwise) relative to sub-pattern 202a, sub-pattern 202c is rotated by +12° (clockwise) relative to sub-pattern 202b, sub-pattern 202d is rotated by +12° (clockwise) relative to sub-pattern 202c, and so on. By way of another example, as shown in FIG. 2B, each of the sub-patterns 202a-202i has a cross shape. In this example, each cross shape is rotated by 9° relative to its nearest neighboring sub-pattern. By way of another example, as shown in FIG. 2C, each of the sub-patterns 202a-202i has a triangle shape (e.g., open-cornered triangle). In this example, each triangle shape is rotated by 12° relative to its nearest neighboring sub-pattern. It is noted that the sub-patterns of the reference point targets 110 of the present disclosure are not limited to the three-ray shape, the cross shape, or the triangle shape depicted in FIGS. 2A-2C. Rather, it is noted that the scope of the present disclosure may be extended to any shape known in the art and capable of reducing sub-pattern-to-sub-pattern ambiguity in an image capturing process.

In embodiments, the sub-patterns 202a-202i of a given reference point pattern 110 have a different shape. For example, as shown in FIG. 2D, each of the sub-patterns 202a-202i has a different shape. In this example, the various shapes of the sub-patterns 202a-202i may include, but are not limited to, a cross, circle, star, triangle, ray, or arrow. It is noted that the sub-patterns of the reference point targets 110 of the present disclosure are not limited to the shapes depicted in FIG. 2D. Rather, it is noted that the scope of the present disclosure may be extended to any set of shapes known in the art and capable of reducing sub-pattern-to-sub-pattern ambiguity in an image capturing process.

Referring again to FIG. 1A, in embodiments, the controller 104 receives image data of the two or more reference point targets 110a, 110b from the imaging sub-system 102. Then, the controller 104 may determine a center location for each of the two or more reference point targets. In embodiments, the controller 104 determines the center location of each of the two or more reference point targets using the following procedure. In embodiments, the controller 104 may identify each sub-pattern within a respective reference point target via a pattern recognition process. For example, any pattern recognition algorithm/software may be used by controller 104 to identify the sub-patterns 202a-202i within each of the reference point targets 110a, 110b. For example, the controller 104 may apply any correlation or geometric model finder (GMF) known in the art.

In embodiments, once the sub-patterns 202a-202i of a respective reference point target 110 have been identified, the controller 104 may identify center location candidates for the respective reference point target 110. The step of identifying the center location candidates for the respective reference point target 110 may include applying a model to the acquired image data for each sub-pattern 202a-202i of the respective reference point target 110. This model generates a hotspot for each sub-pattern that identifies a center location candidate for the respective reference point target 110. In this regard, the model/models executed by the controller 104 are digital representations of the sub-patterns 202a-202i of the reference point target 110. The model contains hotspot information, which is correlated with the modeled sub-pattern information. As such, once the controller 104 identifies a given sub-pattern (one of 202a-202i) then the model will identify the hotspot location associated with the particular sub-pattern (one of 202a-202i). This hotspot location corresponds to the center location candidate for the particular sub-pattern.

Figure 3:
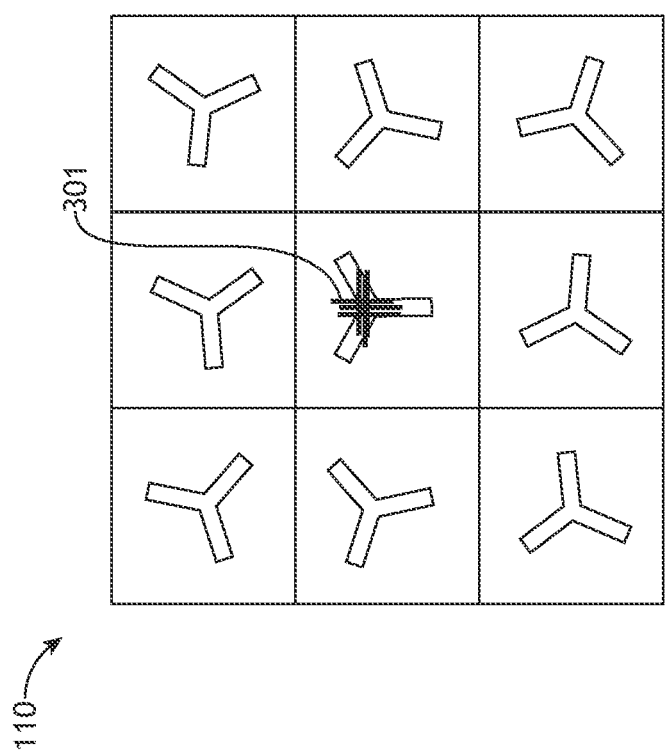
FIG. 3 illustrates a top plan view of a reference point target depicting a location of the center location candidates identified by the sub-patterns of the reference point target, in accordance with one or more embodiments of the present disclosure.

In embodiments, once the controller 104 identifies each of the center location candidates (via hotspot location identification for each sub-pattern), the controller 104 then determines a center location for the respective reference point 110 target based on the identified center location candidates. In embodiments, the controller 104 may carry out a voting scheme. In this case, the controller 104 may identify the center location of a respective reference point target 110 as the center location candidate identified by a majority of the identified sub-patterns 202a-202i. For example, as shown in FIG. 3, hotspot information for each of the sub-patterns 202a-202i may point to a center location candidate. The center location candidates are represented by the crosses 301 in FIG. 3. The controller 104 may designate the center location candidate that is most identified by the hotspots of the sub-patterns 202a-202i as the center location of the entire complex pattern of the reference point target 110.

It is noted that the slight variations of the locations of the crosses 301 in FIG. 3 represent variation in the pattern recognition process for each sub-pattern. Due to these variations, analysis applied by the controller 104 may apply a selected tolerance, which provides an allowable variance of the center location candidates. In this example, center location candidates that fall within the same selected tolerated area should be treated as the 'same' central location candidate. In this case, the controller 104 may calculate the final location as an average of found locations.

In embodiments, after the center locations of each of the reference point targets 110a, 110b have been acquired, the controller 104 may determine an orientation of the wafer 112 relative to a coordinate system of the stage 114 based on the center location determined for each of the two or more reference point targets as previously described (see FIG. 1B). In embodiments, once the wafer orientation has been determined, the controller 104 directs the stage 114 to adjust the position (e.g., rotational position) of the wafer 112 to align the wafer 112 with the stage coordinate system based on the determined orientation of the wafer 112.

Figure 4:
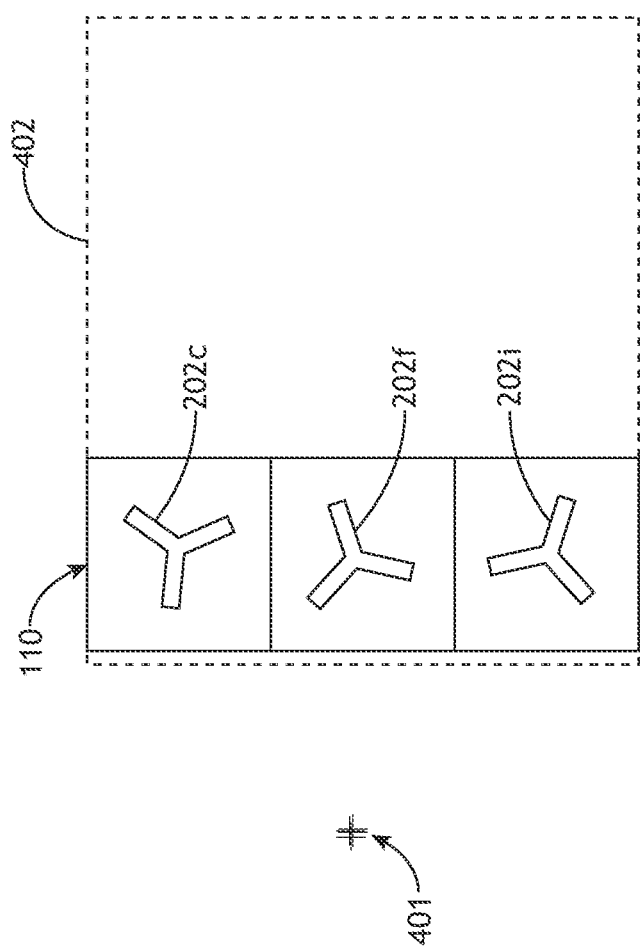
FIG. 4 illustrates a top plan view of a reference point target when the reference point target is only partially located within the field of view (FOV), in accordance with one or more embodiments of the present disclosure.

FIG. 4 illustrates a top plan view of a reference point target 110 where the reference point target is only partially located within the FOV, in accordance with one or more embodiments of the present disclosure. In the case where a reference point target 110 is observed only partially in FOV 404, but with some sub-patterns, such as 202c, 202f, and 202i, still fully included in the FOV 404, the embodiments of the present disclosure will lead to successful acquisition. For example, a shift in the x-direction by ⅔ of the FOV 404 will cause only ⅓ of the reference point target 110 to reside within the FOV 404. In this example, only three sub-patterns 202c, 202f, and 202i will fully reside in the FOV 404. In embodiments, these three sub-patterns 202c, 202f, and 202i will be acquired by the controller 104 and the hotspot information associated with the three sub-patterns 202c, 202f, and 202i will point at the correct center location 401 for the reference point target 110, even though the center of the reference point target 110 is out of the FOV.

Figure 5:
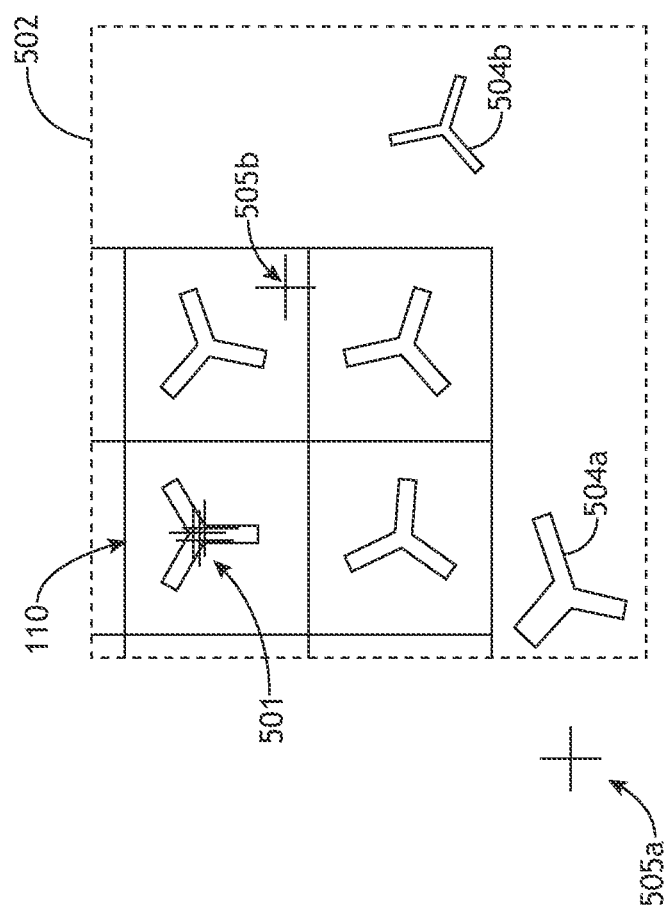
FIG. 5 illustrates a top plan view of a reference point target when foreign structures/patterns not part of the reference point target are located within the FOV, in accordance with one or more embodiments of the present disclosure.

FIG. 5 illustrates a top plan view of a reference point target 110 where foreign structures/patterns not part of the reference point target 110 are located within the FOV, in accordance with one or more embodiments of the present disclosure. In this case, the foreign structures/patterns 504a, 504b may be acquired by the imaging sub-system 102 and analyzed by the controller 104. However, during the acquisition process, the hotspot information that is acquired for each of the foreign structures/patterns 504a, 504b will point to different center point locations 505a, 505b. At the same time, acquisitions of real sub-patterns 202a-202i will all point to the same location 501 (within a selected tolerance) and will be chosen as the correct center location of the center location of the reference point target 110. In the example depicted in FIG. 5, reference point target 110 is seen only partially in the FOV 502, with 4 of 9 cells contained within the FOV 502. In addition, two foreign structures/patterns 504a, 504b are present near the reference point 110, which amount to noise. The crosses 501 represent correct detections, while crosses 505a, 505b represent locations pointed by falsely detected patterns. In this case, reference point center is found correctly since 4 found patterns pointed to the same location (within a selected tolerance level) compared to two foreign patterns that each pointed to different locations.

It is noted that the complexity and the nature of reference pattern targets of the present disclosure are highly unique and significantly reduces the risk of false acquisition of other patterns. The main factors increasing uniqueness are the inclusion of non-orthogonal lines and the fact that reference point targets are built from multiple independent and unique sub-patterns organized in a specified order.

In embodiments, the reference point target 110 may not be observed in the FOV at all. In this case, a scan may be carried out without overlap to find the reference point target 110. Since overlap is not required, the number of required image grabs will be reduced and the time of search will be shorter. For example, in a case when FOV size is equal to X μm and the reference point target is X by X μm, the scan step may be set to X μm as well. In other words, the scan step size can be made as large as the size of the FOV.

Figure 6:
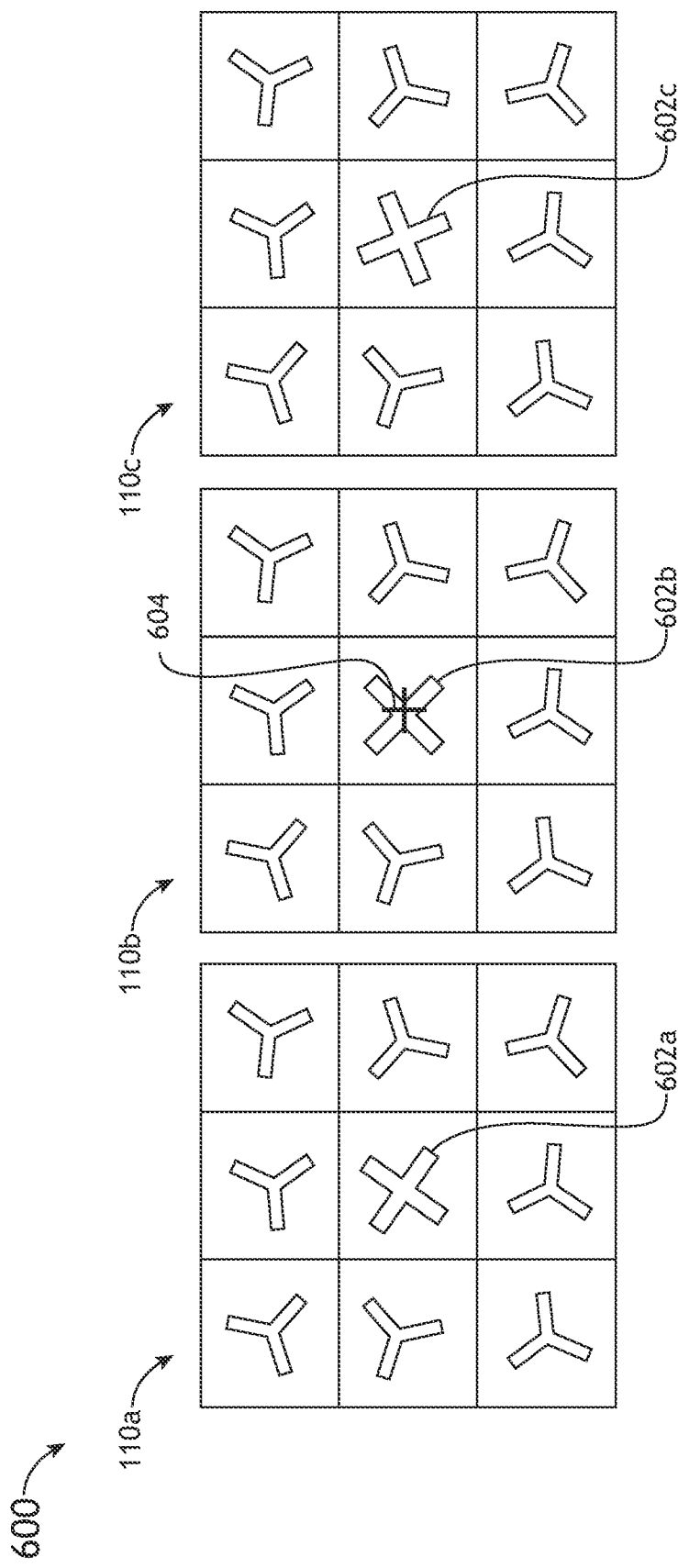
FIG. 6 illustrates a top plan view of a series of reference point targets configured to reduce search time and the number of image grabs, in accordance with one or more embodiments of the present disclosure.

FIG. 6 illustrates a top plan view of a series 600 of reference point targets 110a-110c configured to reduce search time and the number of image grabs, in accordance with one or more embodiments of the present disclosure. For example, in cases where large navigation distances before arrival to reference point location is required, the series of reference point targets 110a-110c may be printed in the scribe line of a wafer to eliminate the need to search along one of the axes. This approach reduces the number of image grabs during the search process as a square root of grabs required to search along both axes.

In embodiments, each reference point target 110a-110c includes a modified pattern, where the central sub-patterns 602a-602c are replaced with a different pattern. For example, as shown in FIG. 6, the center three-ray sub-pattern as used throughout the present disclosure has been replaced by the crosses 602a-602c. In embodiments, the central sub-patterns 602a-602c are oriented at different angles. In embodiments, a two-phase acquisition may be applied to identify a block center location 604, which represents the center location of the block of three reference point targets 110a-110c. The two-phase acquisition may include acquiring the center location of a given reference point target (one of 110a-110c) using the eight non-center sub-patterns, which is in the FOV. Then, the FOV may be centered on the center location of the given reference point target and the acquisition process may be applied to the central sub-patterns 602a-602c, whereby the controller 104 is programed such that the hotspots from the applied model point the central sub-patterns 602a-602c to the center location 604 of the block of three reference point targets 110a-110c. It is noted that this second acquisition phase operates in the same manner as the acquisition process described throughout the present disclosure, with the hotspot information pointing to the block center location rather than the individual reference target center location.

In the example of FIG. 6, the series 600 of reference pattern targets 110a-110c covers a distance equal to three times the FOV width (along X direction) and allows for the elimination of searching along the X direction for navigation errors within this budget. As such, only searching along the Y direction is required. During such a scan along the Y direction, once any of the reference point targets 110a-110c is captured, the X location is found as described above.

Figure 7:
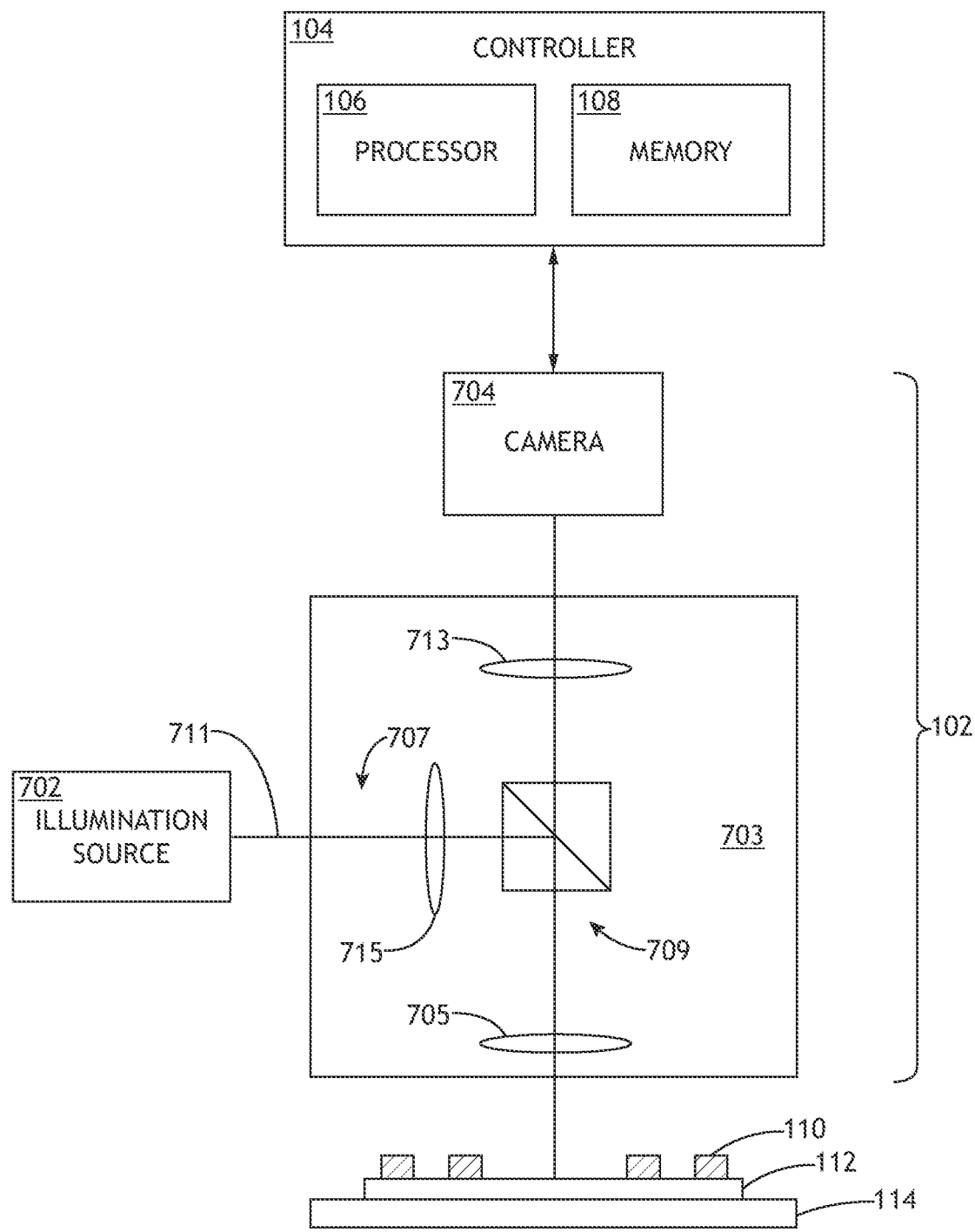
FIG. 7 is a simplified schematic view of the wafer alignment system, in accordance with one or more embodiments of the present disclosure.

FIG. 7 is a simplified schematic view of the wafer alignment system 100, in accordance with one or more embodiments of the present disclosure. The system 100 may generate one or more images of a wafer 112 on at least one camera 704 using any method known in the art. In embodiments, the system 100 includes an imaging sub-system 102 and a controller 104.

The imaging sub-system 102 includes an illumination source 702 to generate an illumination beam 711. The illumination source 702 may include any illumination source known in the art. For example, the illumination source 711 may include a broadband (e.g., plasma broadband source) or a narrowband (e.g., one or more lasers). The illumination beam 711 may include one or more selected wavelengths of light including, but not limited to, vacuum ultraviolet (VUV) light, deep ultraviolet (DUV) light, ultraviolet (UV) light, visible light, or infrared (IR) light. The illumination source 702 may further produce an illumination beam 711 having any temporal profile. For example, the illumination source 702 may produce a continuous illumination beam 711, a pulsed illumination beam 711, or a modulated illumination beam 711. Additionally, the illumination beam 711 may be delivered from the illumination source 702 via free-space propagation or guided light (e.g., an optical fiber, a light pipe, or the like).

In embodiments, the imaging sub-system 102 includes a set of optics 703. The illumination source 702 directs the illumination beam 711 to a wafer 112 via an illumination pathway 707. The illumination pathway 710 may include one or more optical components 715 suitable for modifying and/or conditioning the illumination beam 711. For example, the one or more illumination optical components 715 may include, but are not limited to, one or more lenses, one or more mirrors, one or more polarizers, one or more filters, one or more beam splitters, one or more diffusers, one or more homogenizers, one or more apodizers, or one or more beam shapers. In embodiments, the imaging sub-system 102 includes an objective lens 705 to focus the illumination beam 711 onto the sample 112.

In embodiments, the wafer 112 is disposed on a wafer stage 114. The wafer stage 114 may include any device suitable for positioning/rotating the wafer 112 within the system 100. For example, the wafer stage 114 may include any combination of linear translation stages, rotational stages, tip/tilt stages or the like.

In embodiments, camera 704 (or detector/sensor) is configured to capture illumination emanating from the wafer 112 and reference point targets 110 through a collection pathway 709. The collection pathway 709 may include any number of collection optical components 713 to direct and/or modify illumination collected by the objective lens 705 including, but not limited to, one or more lenses, one or more mirrors, one or more polarizers, one or more filters, one or more beam splitters, one or more diffusers, one or more homogenizers, one or more apodizers, or one or more beam shapers.

The camera 704 may include any camera or detector system known in the art suitable for measuring and/or imaging illumination received from the wafer 112 and reference point targets 110. For example, the camera 704 may include one or more sensors suitable for generating one or more images of wafer 112 and reference point targets 110 such as, but is not limited to, a charge-coupled device (CCD), a complementary metal-oxide-semiconductor (CMOS) sensor, a photomultiplier tube (PMT) array, or an avalanche photodiode (APD) array. By way of another example, a detector 104 may include a sensor suitable for generating one or more images of the wafer 112 and reference point targets 110 in motion (e.g., a scanning mode of operation). For instance, the camera 704 may include a line sensor including a row of pixels. In this regard, the system 100 may generate a continuous image (e.g., a strip image) one row at a time by translating the wafer 112 in a scan direction perpendicular to the pixel row through a measurement field of view and continuously clocking the line sensor during a continuous exposure window. In another instance, the camera 704 may include a TDI sensor including multiple pixel rows and a readout row. The TDI sensor may operate in a similar manner as the line sensor, except that clocking signals may successively move charge from one pixel row to the next until the charge reaches the readout row, where a row of the image is generated. By synchronizing the charge transfer (e.g., based on the clocking signals) to the motion of the sample along the scan direction, charge may continue to build up across the pixel rows to provide a relatively higher signal to noise ratio compared to the line sensor.

In another embodiment, the system 100 includes a controller 130. In another embodiment, the controller 130 includes one or more processors 132 configured to execute program instructions maintained on a memory medium 134. In this regard, the one or more processors 132 of controller 130 may execute any of the various process steps described throughout the present disclosure. Further, the controller 130 may be configured to receive data including, but not limited to, images of the wafer 112 from the detector 104).

The one or more processors 106 of a controller 104 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 106 may include any device configured to execute algorithms and/or instructions (e.g., program instructions stored in memory). In embodiments, the one or more processors 106 may be embodied as a desktop computer, mainframe computer system, workstation, image computer, parallel processor, networked computer, or any other computer system configured to execute a program configured to operate or operate in conjunction with the system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 104 may include one or more controllers housed in a common housing or within multiple housings. In this way, any controller or combination of controllers may be separately packaged as a module suitable for integration into system 100. Further, the controller 104 may analyze data received from the detector 104 and feed the data to additional components within the system 100 or external to the system 100.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory (ROM), a random-access memory (RAM), a magnetic or optical memory device (e.g., disk), a magnetic tape, a solid-state drive and the like. It is further noted that memory medium 108 may be housed in a common controller housing with the one or more processors 106. In embodiments, the memory medium 108 may be located remotely with respect to the physical location of the one or more processors 106 and controller 104. For instance, the one or more processors 106 of controller 104 may access a remote memory (e.g., server), accessible through a network (e.g., internet, intranet and the like).

Figure 8:
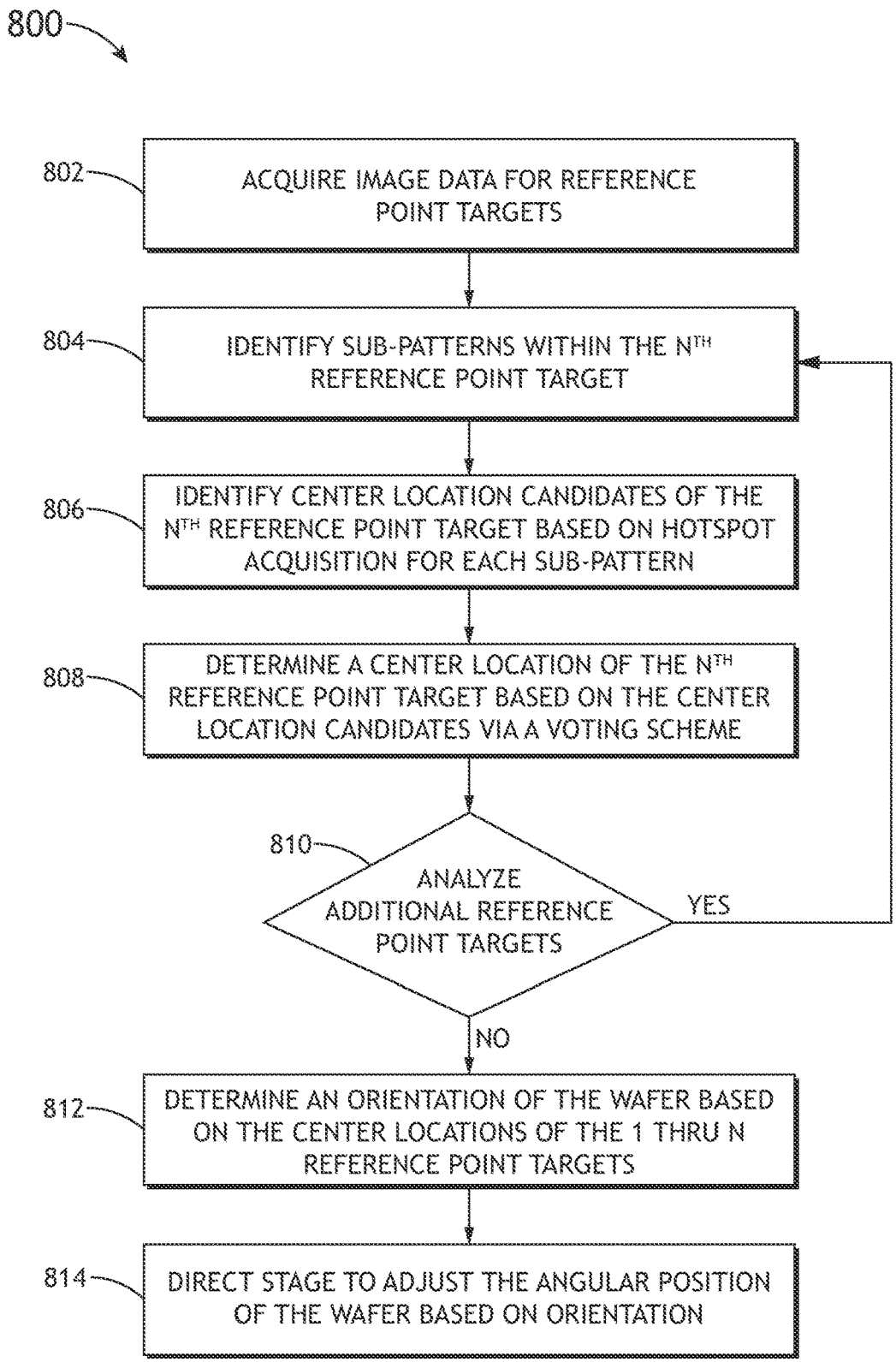
FIG. 8 illustrates a flow diagram depicting a method of wafer alignment, in accordance with one or more embodiments of the present disclosure.

FIG. 8 illustrates a flow diagram 800 depicting a method of wafer alignment, in accordance with one or more embodiments of the present disclosure. Applicant notes that the embodiments and enabling technologies described previously herein in the context of the wafer alignment system 100 should be interpreted to extend to the method 200. It is further noted, however, that the method 800 is not limited to the architecture of the wafer alignment system 100. In step 802, image data for two or more reference point targets is acquired. For example, as shown in FIGS. 1A-7, the imaging sub-system 102 may capture image data for two or more reference point targets 110a, 110b and transmit the image data to controller 104. In step 804, sub-patterns within the Nth reference point target are identified. For example, as shown in FIGS. 1A-7, the controller 104 may perform a pattern recognition process to identify the sub-patterns with the Nth reference point target 110. In step 806, center location candidates of the Nth reference point target 110 are identified based on hotspot acquisition of each sub-pattern. For example, as shown in FIGS. 1A-7, the controller 104 may apply a model to each sub-pattern (e.g., 202a-202i) of the Nth reference point target 110, whereby the model identifies a hotspot that corresponds to a center location candidate for each sub-pattern (e.g., 202a-202i). In step 808, a center location of the Nth reference point target 110 is determined based on the center location targets found in step 806. For example, as shown in FIGS. 1A-7, the controller 104 may apply a voting scheme that identifies the center location of the Nth reference target 110 based on the center location candidate identified by the majority of the sub-patterns (via hotspot of model). In step 810, the controller 104 determines whether there are additional reference point targets to analyze. If there are additional reference point targets to analyze, then the method 800 repeats steps 802 through 810 until all reference point targets are analyzed. If there are not any additional reference point targets to analyze, then the method 800 moves to step 812. In step 812, the controller 104 determines an orientation of the wafer based on the center locations (identified in steps 802-810) of the 1 through N reference point targets 110. In step 814, the controller 104 directs the stage to adjust an angular position of the wafer based on the orientation determined in step 812.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," "temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

The invention claimed is:

1. A wafer alignment system comprising:
an imaging sub-system;
a stage configured to secure and actuate a wafer, wherein two or more reference point targets are formed on the wafer, wherein each reference point target comprises a plurality of sub-patterns arranged in an array, wherein each sub-pattern is different from the other sub-patterns of the plurality of sub-patterns;
a controller coupled to the imaging sub-system and the stage, the controller including one or more processors configured to execute program instructions causing the one or more processors to:
receive image data of the two or more reference point targets from the imaging sub-system;
determine a center location for each of the two or more reference point targets, wherein determining the center location of each of the two or more reference point targets comprises:
identify each sub-pattern within a respective reference point target via a pattern recognition process;
identify a plurality of center location candidates for the respective reference point target, wherein identifying the plurality of center location candidates for the respective reference point target comprises: applying a model to each identified sub-pattern of the respective reference point target, wherein the model generates a hotspot for each sub-pattern that identifies a center location candidate for the respective reference point target; and
determine a center location for the respective reference point target based on the plurality of center location candidates;
determine an orientation of the wafer relative to a coordinate system of the stage based on the center location determined for each of the two or more reference point targets; and
direct the stage to adjust the rotational position of the wafer to align the wafer with the stage coordinate system based on the determined orientation of the wafer.

2. The system of claim 1, wherein the determining a center location of the respective reference point target based on the plurality of center candidates comprises:
determining the center location of the respective reference point target based on the plurality of center location candidates via a voting scheme, wherein the voting scheme identifies the center location as the center location candidate identified by a majority of the identified sub-patterns.

3. The system of claim 2, wherein the controller is further configured to apply a selected tolerance when executing the voting scheme, wherein the selected tolerance comprises an allowable variance of the plurality of center location candidates.

4. The system of claim 1, wherein an area of each reference point target is substantially equal to a field of view of the imaging sub-system.

5. The system of claim 1, wherein a first reference point target is in a first field and a second reference point target is in a second field.

6. The system of claim 1, wherein each sub-pattern of the two or more reference point patterns has a same shape and different orientation from the other sub-patterns.

7. The system of claim 6, wherein each sub-pattern comprises a three-ray pattern and is rotated by twelve degrees relative to a neighboring sub-pattern.

8. The system of claim 6, wherein each sub-pattern comprises a cross pattern and is rotated by nine degrees relative to a neighboring sub-pattern.

9. The system of claim 6, wherein each sub-pattern comprises a triangle pattern and is rotated by twelve degrees relative to a neighboring sub-pattern.

10. The system of claim 1, wherein each sub-pattern of the two or more reference point patterns has a different shape.

11. The system of claim 1, wherein at least one of the sub-patterns comprise at least one of a cross, circle, star, triangle, ray, or arrow.

12. The system of claim 1, wherein the reference point targets are lithographically formed on the wafer.

13. The system of claim 1, wherein the stage comprises at least one of a rotational stage or translational stage.

14. The system of claim 1, wherein the imaging sub-system comprises:
an illumination source;
a set of optics; and
a camera.

15. The system of claim 1, wherein the imaging sub-system comprises at least one of an imaging overlay metrology sub-system or an inspection sub-system.

16. The system of claim 1, wherein the controller is further configured to implement a two-phase acquisition process utilizing at least three reference point targets, wherein a center sub-pattern of each of the reference point targets is different from the outer sub-patterns of each of the reference point targets.

17. A wafer alignment method comprising:
acquiring image data of reference point targets including a set of sub-patterns;
determining a center location for each of the reference point targets, wherein determining the center location of each of the two or more reference point targets comprises:
identifying each sub-pattern within a respective reference point target via a pattern recognition process;
identifying a plurality of center candidates for the respective reference point target, wherein identifying the plurality of center point candidates for the respective reference point target comprises: applying a model to each identified sub-pattern of the respective reference point target to identify a center location candidate of the respective reference point target, wherein the model generates a hotspot for each sub-pattern that identifies a center location candidate associated with the respective reference point target; and
determining a center location of the respective reference point target based on a plurality of center location candidates;
determining an orientation of the wafer relative to a coordinate system of a stage based on the center location determined for each of the two or more reference point targets; and
directing the stage to adjust the rotational position of the wafer to align the wafer with the stage coordinate system based on the determined orientation of the wafer.

18. The method of claim 17, wherein the determining a center location of the respective reference point target based on the plurality of center location candidates comprises:
determining the center location of the respective reference point target based on the plurality of center location candidates via a voting scheme, wherein the voting scheme identifies the center location as the center location candidate identified by a majority of the identified sub-patterns.

19. The method of claim 18, further comprising: applying a selected tolerance when executing the voting scheme, wherein the selected tolerance comprises an allowable variance of the center location candidates.

20. The method of claim 17, wherein an area of each reference point target is substantially equal to a field of view of an imaging sub-system.

21. The method of claim 17, wherein a first reference point target is in a first field of the wafer and a second reference point target is in a second field of the wafer.

22. The method of claim 17, wherein each sub-pattern of the two or more reference point patterns has the same shape and different orientation from the other sub-patterns.

23. The method of claim 22, wherein each sub-pattern comprises a three-ray pattern and is rotated by twelve degrees relative to a neighboring sub-pattern.

24. The method of claim 22, wherein each sub-pattern comprises a cross pattern and is rotated by nine degrees relative to a neighboring sub-pattern.

25. The method of claim 22, wherein each sub-pattern comprises a triangle pattern and is rotated by twelve degrees relative to a neighboring sub-pattern.

26. The method of claim 17, wherein each sub-pattern of the two or more reference point patterns has a different shape.

27. The method of claim 17, wherein at least one of the sub-patterns comprise at least one of a cross, circle, star, triangle, ray, or arrow.

28. The method of claim 17, wherein the reference point targets are lithographically formed on the wafer.

29. The method of claim 17, further comprising: implementing a two-phase acquisition process utilizing at least three reference point targets, wherein a center sub-pattern of each of the reference point targets is different from the outer sub-patterns of each of the reference point targets.

* * * * *